United States Patent [19]

Walter

[11] Patent Number: 4,770,640

[45] Date of Patent: Sep. 13, 1988

[54] ELECTRICAL INTERCONNECTION DEVICE FOR INTEGRATED CIRCUITS

[76] Inventor: Howard F. Walter, 34013 First Cir. South, Apt. D, Federal Way, Wash. 98003

[21] Appl. No.: 508,053

[22] Filed: Jun. 24, 1983

[51] Int. Cl.$^4$ .......................................... H01R 9/09
[52] U.S. Cl. ...................................... 439/69; 361/393
[58] Field of Search ............ 339/17 M, 17 LM, 17 N, 339/17 CF, 17 E; 361/395, 396, 412, 413, 414, 393; 439/68–71, 74

[56] References Cited

U.S. PATENT DOCUMENTS

| | | | |
|---|---|---|---|
| 2,995,686 | 8/1961 | Selvin | 361/395 |
| 3,219,886 | 11/1965 | Katzin | 339/17 N |
| 3,243,661 | 3/1966 | Ullery, Jr. | 361/393 |
| 3,403,300 | 9/1968 | Horowitz et al. | 361/414 |
| 3,761,858 | 9/1973 | Oka | 361/393 |
| 4,076,357 | 2/1978 | Cistola | 361/413 |
| 4,202,007 | 5/1980 | Dougherty et al. | 357/80 |
| 4,250,536 | 2/1981 | Barringer et al. | 361/413 |
| 4,252,991 | 2/1981 | Iwabushi | 174/68.5 |
| 4,283,755 | 8/1981 | Tracy | 361/393 |
| 4,336,088 | 6/1982 | Hetherington et al. | 156/89 |
| 4,357,647 | 10/1982 | Hadersbeck et al. | 361/400 |
| 4,502,098 | 2/1985 | Brown et al. | 361/412 |

FOREIGN PATENT DOCUMENTS

2077050 4/1981 United Kingdom.
853837 8/1981 U.S.S.R..

OTHER PUBLICATIONS

IBM Bulletin, Coombs, vol. 16, No. 3, p. 945, 8-1973.
IBM Bulletin, Agusta et al, vol. 10, No. 7, pp. 890-891, 12-1967.
State of the Art, published 1983.
"Scientific American", Oct. 1982.
RCA Technical Notes, TN No. 1316, "Universal Test Fixture for Testing Chip Carriers" by Robert Lindsey Schelborn.
Scientific American, Jul. 1983, "Microelectronic Packaging" by Albert J. Blodgett, Jr.
Paul C. Michaelis and Peter I. Bonyhard, IEEE Transactions on Magnetics, vol. Mag-9, No. 3, Sep. 1973, Magnetic Bubble Mass Memory-Module Design and Operation.
VLSI Technologies, 1982, published by IEEE, p. 319.
Science Digest, Dec. 1985, p. 9, by Stephen Solomon.
Science Digest, Dec. 1985, p. 44.

Primary Examiner—Neil Abrams
Attorney, Agent, or Firm—Jeffers, Hoffman & Niewyk

[57] ABSTRACT

An electrical interconnection device provides electrical connection between any two or more microelectronic layers in a multilayer microelectronic device, or between the layers and an external electrical device. The electrical interconnection device is a monolithic integrated circuit with a pattern of conductive paths fabricated on its surface, and is placed directly against the side edges of a multilayer microelectronic device such that the paths on the electrical interconnection device contact associated conductive pathways exposed at the side edges of the layers of the microelectronic structure.

9 Claims, 5 Drawing Sheets

ELECTRICAL INTERCONNECTION DEVICE FOR INTEGRATED CIRCUITS

BACKGROUND OF THE INVENTION

This invention pertains to an electrical interconnection device, and more particularly to such a device for electrically interconnecting individual layers of a multilayer microelectronic structure with each other and with other electrical devices.

The present invention is addressed to the interconnection difficulties created when integrated circuits or other microelectronic structures are stacked or layered together, such a structure being termed in this application as a stratolith. The present invention provides a unique interconnection with the multilayered structure using a specially fabricated monolithic integrated circuit device.

By way of example, in applicant's U.S. Pat. No. 4,506,387 a Programming-On-Demand Cable System is described which makes it desirable to incorporate as much computer-type memory as possible in the limited volume of a home entertainment consumer device, such as a television. The minimum memory capacity desired is forty billion bytes. If such a memory were constructed from existing discrete devices, such as a 256 kilobit RAM or bubble memory module, as many as 1,220,704 units would be needed, enough to fill a large room.

A typical 256 kilobit memory chip has a memory density of 32 kilobytes per 25 mm$^2$, or, in other words, 128 kilobytes per cm$^2$. Using wafer scale integration and stratolithic technology to create a stack of double-sided wafers 200 microns thick, the memory density would be 13,107,200 bytes per cm$^3$. Forty billion bytes would therefore require about 3,052 cm$^3$. This is approximated by a cube 15 centimeters on each side, a much more manageable size.

One problem that must be addressed before chips can be stacked in such a stratolith is that of interconnection between individual layers and external devices. When chips are only fifty microns thick, it is virtually impossible, using any prior art technique known to the applicant, to make specific connections to chips stacked as described above. The present invention accomplishes such connections by applying integrated circuit technology to fabricate what are essentially microscopic connections, in keeping with the microscopic thicknesses of the chips.

SUMMARY OF THE INVENTION

The present invention provides a unique and novel device, called hereinafter a stratoplexer, which allows interconnections between one or more layers in a multilayer microelectronic structure, called hereinafter a stratolith, or between a layer and an external electrical device.

A monolithic integrated circuit is fabricated by well-known integrated circuit manufacturing techniques, and contains on its surface a plurality of conductive paths scaled at about five microns, although other sizes can be used. These paths are arranged in a regular parallel pattern, spaced on centerlines about fifteen microns apart. Again, other distances can be easily used. The stratoplexer is designed to be placed face-on against the side edges of the stratolith. When connections are desired between layers, or between any one or more layers and an external device, conductive paths are deposited during fabrication to a specific point at the edge of the layer. When the stratoplexer is aligned with and attached to the side of the properly prepared stratolith, the conductive paths on the stratoplexer and stratolith electrically contact, thereby forming electrical connections therebetween.

In the case where a connection is required between two or more layers, the pathways thereon are fabricated so as to contact in common a single conductive path on the stratoplexer.

In the case where a connection is required between a layer and an external device, the pathway on that layer is fabricated so as to contact one of the specific paths on the stratoplexer which extends beyond the interface region to the top of the stratoplexer, where a connection pad is provided and suited to have an electrical wire soldered thereto, or other similar electrical connections.

A modification of the stratoplexer of the present invention is provided for use with a high-capacity memory stratolith, or any other multilayer structure, which require communication between each layer and an external device, but which has too many layers to allow electrical connection with the external device due to limited space available on the stratoplexer for connection pads. In this modification, one or more microprocessors are fabricated in an overlap area of the stratoplexer. These can serve to multiplex and demultiplex data passing between the numerous layers, and to act as a data bus to external devices.

In one form of the present invention there is provided an electrical interconnection device in combination with a multilayer microelectronic structure including a plurality of microelectronic layers having respective conductive pathways terminating as electrical contact points at side edges of respective ones of the microelectronic layers. The electrical interconnection device comprises a substantially planar body having opposite surfaces, one of the surfaces having on a portion thereof a conductive path. The planar surface portion is disposed against certain ones of the side edges of the microelectronic layers with the conductive path in electrical contact with two of the electrical contact points, thereby electrically connecting respective conductive pathways of the two electrical contact points.

It is an object of the present invention to provide in combination with a multilayer microelectronic structure, an improved electrical interconnection device for electrically interconnecting any two conductive pathways of any one or more microelectronic layers.

Another object of the present invention is to provide in combination with a multilayer microelectronic structure, an improved electrical interconnection device for electrically interconnecting at least one conductive pathway of at least one microelectronic layer with an external electrical device.

A further object of the present invention is to provide in combination with a multilayer microelectronic structure, an improved electrical interconnection device which provides multiplexing and demultiplexing of signals between conductive pathways of the microelectronic layers.

Further objects of the present invention will appear as the description proceeds.

BRIEF DESCRIPTION OF THE DRAWINGS

The above mentioned and other features and objects of this invention, and the manner of attaining them, will become more apparent and the invention itself will be better understood by reference to the following detailed description of the invention taken in conjunction with the accompanying drawings, wherein.

DETAILED DESCRIPTION

Figures 1, 2:
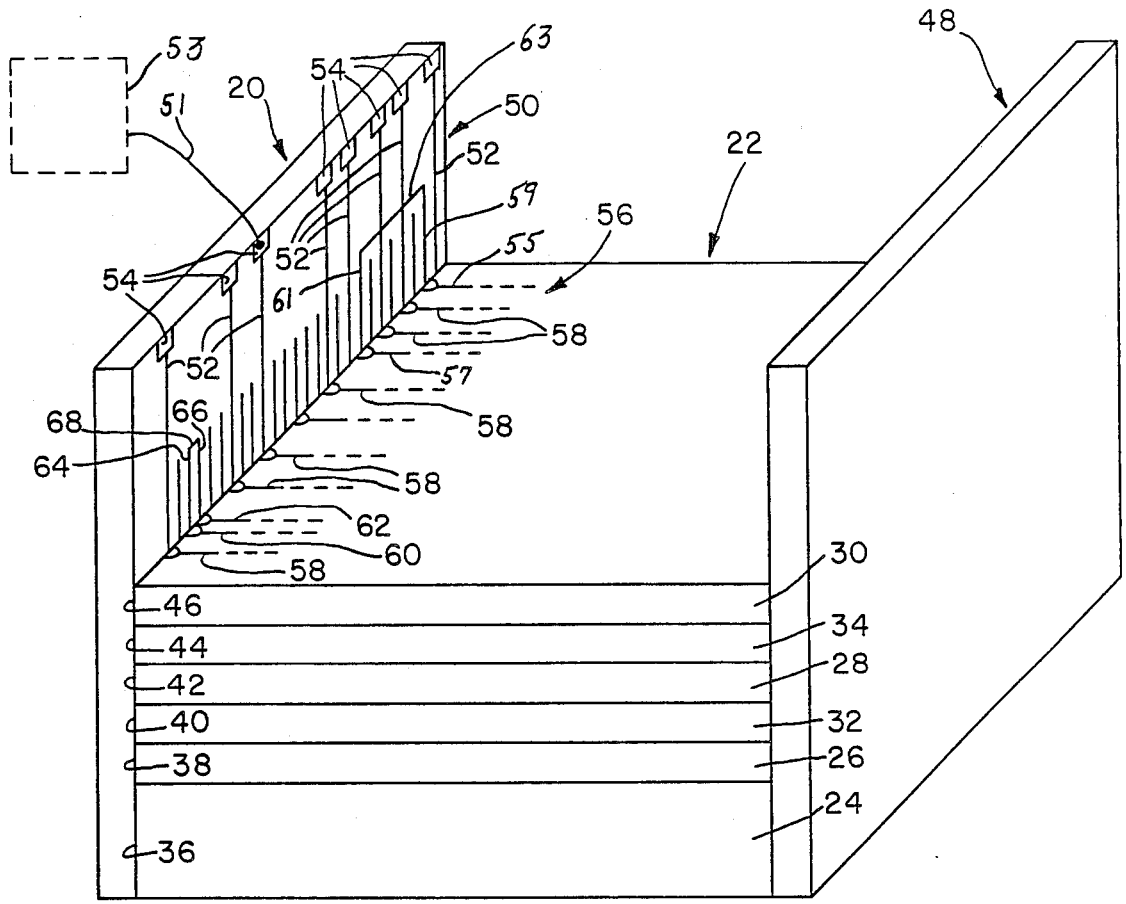
FIG. 1 is a perspective view of one embodiment of the present invention with a multilayer microelectronic structure.
FIG. 2 is a front elevational view of the embodiment in FIG. 1.

Referring to FIGS. 1–4 stratoplexer 20 of the present invention is illustrated in conjunction with multilayer microelectronic structure 22 comprising substrate 24, microelectronic layers 26, 28, 30 and spacer 32 disposed between layers 26, 28 and spacer 34 disposed between layers 28, 30. Layers 26, 28, 30 can be silicon-based integrated circuit chips, bubble memory layers, or a variety of other similar devices. Spacers 32, 34 can be a dielectric material such as silicon dioxide. Typically, layers 26, 28, 30 and spacers 32, 34 are of approximately the same thickness, about fifty microns to about two hundred and fifty microns, however, they do not need to conform to any precise thickness. Stratoplexer 20 is attached to side edges 36, 38, 40, 42, 44, 46 of substrate 24, layer 26, spacer 32, layer 28, spacer 34 and layer 30, respectively. Additional stratoplexers, such as stratoplexer 48, can be attached to other of the side edges of microelectronic structure 22 to perform identical or different operations from stratoplexer 20 with microelectronic structure 22.

The front surface of stratoplexer 20 has disposed thereon a predetermined pattern of parallel conductive paths 50. Some of these paths, such as paths 52, extend to the top of stratoplexer 20 where they terminate in connector pads 54. It should be stressed that these paths 52, as well as the other paths in pattern 50, are much smaller and more numerous than depicted. Typically the paths of pattern 50 are five microns wide and disposed on centerlines spaced fifteen microns apart.

Stratoplexer 20, as well as other stratoplexers 48, is fabricated using integrated circuit technologies. Photolithography can be used to fabricate pattern 50 from aluminum or any other suitable material on a base of any suitable dielectric material, such as glass. Alternatively, a semiconductor base covered by a layer of silicon dioxide can be used.

On the surface of microelectronic layer 30 is pattern 56 of similar conductive pathways proceeding from the interior of layer 30 along its top surface to side edge 46, where they slightly widen thereat. It should be noted that pattern 56 of conductive pathways need not proceed to the top surface of layer 30, but may proceed directly to side edge 46.

When stratoplexer 20 is aligned with and attached to microelectronic structure 22, certain pathways of pattern 56 electrically contact other selective conductive paths of pattern 50. For example, pathways 58 of pattern 56 are electrically connected to paths 52 which terminate in connector pads 54. Therefore, a wire 51, or other similar connection, that is soldered or otherwise connected to a pad 54 is electrically connected to a respective pathway 58 of layer 30 and to an external electrical device 53. This method of electrical connection may naturally be applied to microelectronic layers 26 and 28.

Stratoplexer 20 further provides a unique electrical connection between pathways 60, 62 on layer 30. Pathway 60 is electrically connected to path 64, pathway 62 is electrically connected to path 66, and line 68 connects paths 64, 66, thereby electrically interconnecting pathways 60, 62 of microelectronic layer 30. Pathway 60 can be interconnected with a pathway of layer 26 or 28 by eliminating line 68 and contacting path 64 together with pathway 60 and a pathway of layer 26 or 28. In a similar fashion, any one or more conductive pathways of one microelectronic layer may be electrically interconnected with any one or more conductive pathways of another microelectronic layer, thereby electrically connecting the layers. By thusly interconnecting via stratoplexer 20 one layer with another layer, the need to provide interior electrical interconnection directly between layers 26, 28, 30 during the manufacture of structure 22 is eliminated. Further, since there is much less room for connector pads 54 along the top of stratoplexer 20 than there is room for paths in general, paths leading to connector pads 54 should be reserved for electrical connection to external electrical devices, such as device 53.

Non-adjacent pathways, such as pathways 55, 57 can be interconnected as above, i.e., by means of paths 59, 61 and line 63.

Referring to FIG. 2, stratoplexer 20 generally comprises base 70, interface 72, and overlap 74. Base 70 is intended for contact with substrate 24, there being no pathways in this region. Interface 72 is intended for direct contact with at least side edges 38, 42, 46, and has pattern 50 disposed thereon.

Pattern 50 of conductive pathways can be modified, and pattern 50 as shown in FIGS. 1 and 2 is illustrative only. For example, electrical connections between different layers can be accomplished solely within interface 72, rather than extending any conductive paths into overlap 74. Moreover, it is contemplated by the present invention that a general purpose stratoplexer 20 with a standard pattern 50 can be mass produced on the assumption that multilayer microelectronic structures 20 would be accordingly designed for use therewith. Alternately, stratoplexer 20 can naturally be custom designed according to a user's requirements.

Figure 3:
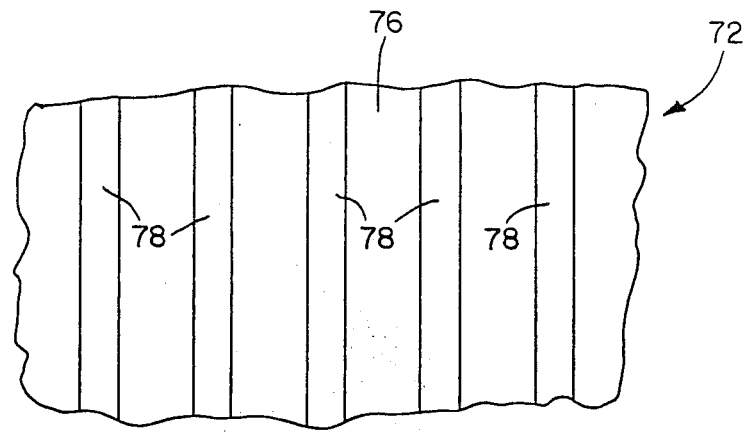
FIG. 3 is an enlarged, fragmentary view of the embodiment in FIG. 2.
Figure 4:
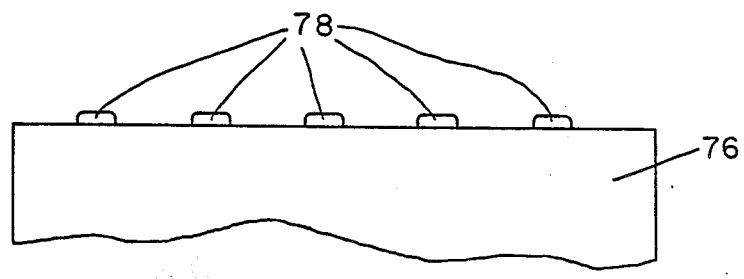
FIG. 4 is an end elevational view of the fragmentary portion of FIG. 3.

Referring now to FIGS. 3 and 4, an enlarged fragmentary view of interface 72 illustrates the nature of pattern 50 of stratoplexer 20. Fragment 76 of interface 72 has a series of conductive paths 78, which can be formed of aluminum or any other suitable material, and are disposed thereon using suitable techniques, such as photolithography. Paths 78 are about five microns wide on centerlines about fifteen microns apart. In a stratoplexer, such as stratoplexer 20, measuring one centimeter horizontally over six hundred and fifty such paths 78 can be provided thereon. As the state-of-the-art can produce much smaller or narrower paths 78 than five microns, more such paths 78 can be produced thereon.

FIG. 4 is an end elevational view of fragment 76 illustrating paths 78 thereon. There is no protective coating, such as silicon dioxide, applied to the top of paths 78 since such would defeat their purpose.

Figure 5:
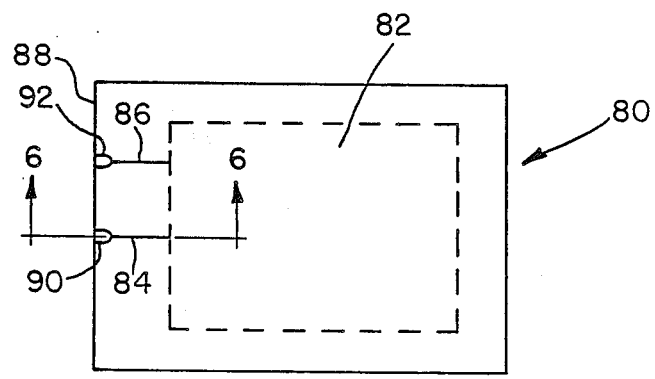
FIG. 5 is a front elevational view of a microelectronic layer.

Referring now to FIGS. 5-8, the preparation of a stratolith, such as structure 22, will be described. It should be recognized that the present invention does not pertain to the methods of designing and constructing stratoliths, and the description to follow is only an example of one such method resulting in a stratolith to be used in conjunction with stratoplexer 20 of the present invention. FIG. 5 illustrates a representative integrated circuit chip 80 wherein the interior 82 of chip 80 is outlined in dashed line. Interior 82 can, for example, be a RAM or the like. Conductive pathways 84, 86 lead from interior 82 to specific points at side edge 88 of chip 80, where they widen slightly as at 90, 92, respectively. There is no oxide or like coating on chip 80 as illustrated in FIG. 5.

Figure 6:
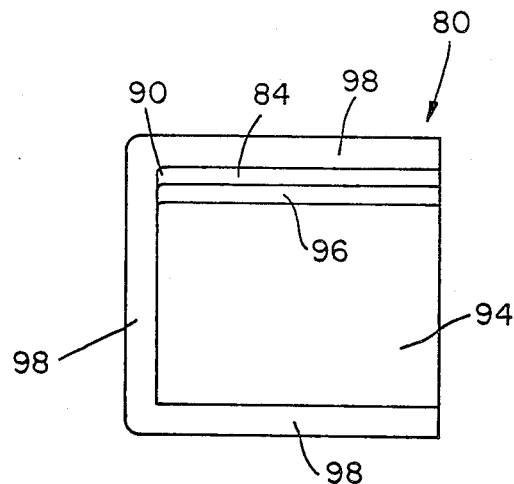
FIG. 6 is a sectional view of FIG. 5 taken along line 6—6 and viewed in the direction of the arrows.

Referring to FIG. 6, chip 80 comprises silicon semiconductor layer 94, silicon dioxide layer 96, conductive pathway 84 deposited on layer 96 and widening slightly at point 90, and silicon dioxide layer 98, which is applied at the conclusion of the fabrication of chip 80.

Figure 7:
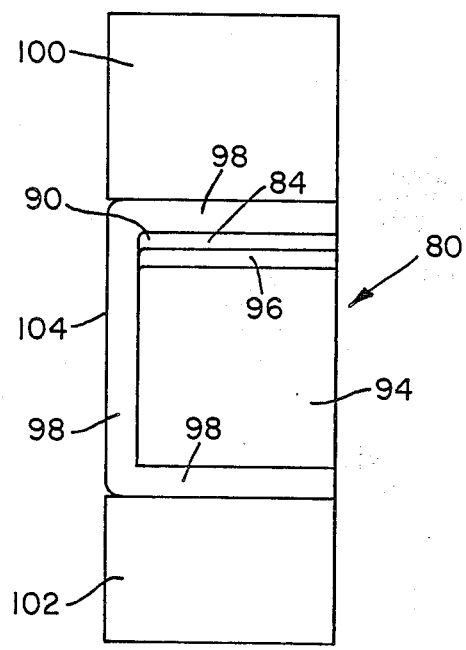
FIG. 7 is similar to FIG. 6 with spacers added thereto.
Figure 8:
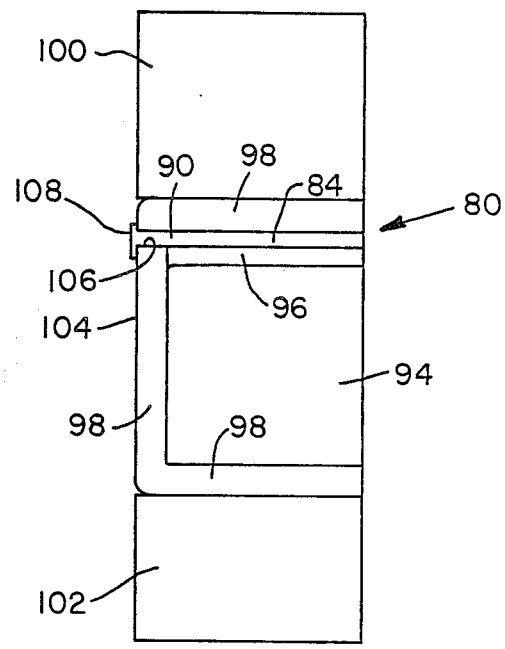
FIG. 8 is similar to FIG. 7 with an electrical connection added thereto.

Referring now to FIG. 7, chip 80 is assembled in a stratolith with spacers 100, 102 thereon, and face 104 is ground and polished preparatory to further processing. Thereafter, a photoresist mask is utilized to provide a proper pattern on face 104. The photoresist protects the surface of face 104 except for those areas where etching or ion milling is used to eat through silicon dioxide layer 98. One such area is adjacent to pathway 84 at point 90. After the etching or milling step is completed, additional photolithography is utilized to deposit aluminum or other suitable material in cavity 106, which has been formed by the etching or milling and is adjacent to point 90. FIG. 8 illustrates the results of the above steps, and further includes a pad 108, which is generally of the same material as conductive pathway 84.

Subsequently, stratoplexer 20 is aligned with and attached to face 104 such that pad 108 of conductive pathway 84 contacts and makes electrical connection with a conductive path on stratoplexer 20. It should be noted that face 104 is one of the side edges 38, 42, 46 earlier described above.

Figure 9:
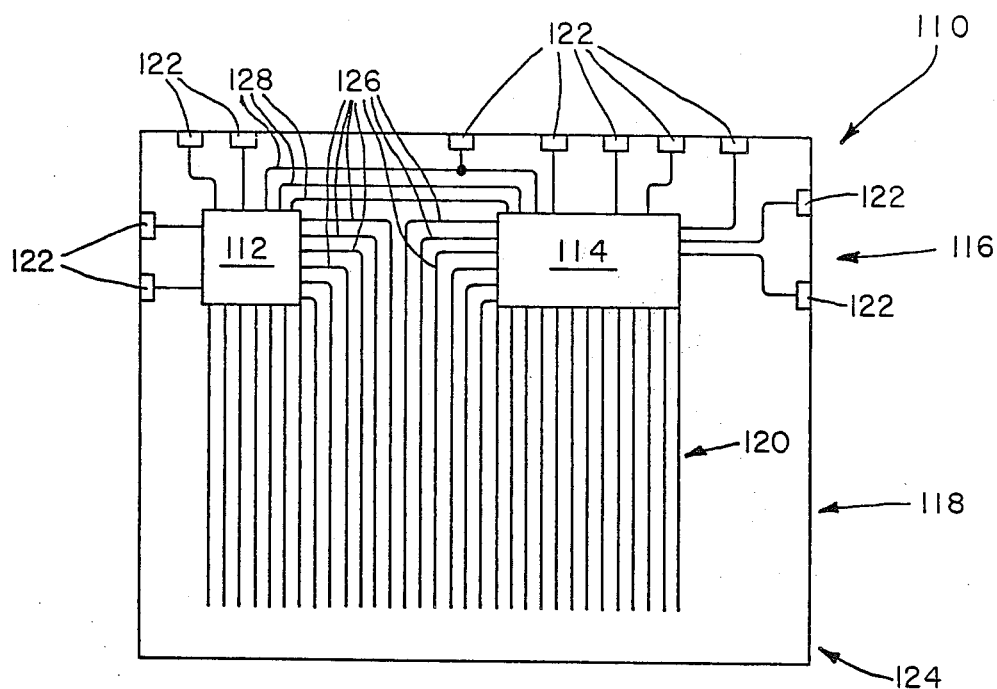
FIG. 9 is a front elevational view of a modification of the embodiment in FIG. 2.

Referring now to FIG. 9, a modification of the present invention will be described for use with high-capacity memory stratoliths or similar devices. FIG. 9 illustrates stratoplexer 110 comprising microprocesssors 112, 114 on overlap 116, interface 118 with pattern 120 of conductive paths thereon, and connector pads 122 along the side edges of overlap 116. Base 124 is provided below interface 118. Note that microprocessors 112, 114 are fabricated in overlap 116, and such fabrication is well-known in the art. Except for connector pads 122, the remaining portion of overlap 116 including microprocessors 112, 114 can be coated with silicon dioxide or a similar material, however, interface 118 remains uncoated by such material.

Generally, connector pads are provided around the edges of microprocessors 112, 114, and since the pads must be large enough to accept soldered wire or other connections, the number of pads that can be provided is limited. In stratoplexer 110 of the present invention, conductive paths 126 proceed from microprocessors 112, 114 into interface 118, where they are intended to contact conductive pathways at the side edges of a stratolith as earlier explained above. In this manner a relatively large number of connections can be made to a large number of microelectronic layers in a stratolith. As can also be seen in FIG. 9, microprocessors 112, 114 are also electrically connected to each other by paths 128. Naturally, more or fewer microprocessors can be used in overlap 116, and other patterns 120 can be disposed on interface 118. Moreover, it should be understood that a pattern disposed on an interface may comprise only one conductive path or a plurality of conductive paths.

In operation, stratoplexer 110 permits a greater number of microelectronic layers in a stratolith to communicate with each other and external electrical devices. Because only a small number of connector pads 122 can be provided in the overlap 116 due to limited space available, microprocessors such as 112 and 114 may be used to multiplex and demultiplex signals between numerous microelectronic layers and connector pads. For example, a sufficient number of connector pads 122 can be provided to accommodate a sixteen line data bus. If a high-capacity memory stratolith is constructed containing a high number of microelectronic layers, its associated stratoplexer, such as stratoplexer 110, can by means of microprocessors 112, 114 decode read or write address signals and output/input the referenced data on the sixteen line data bus.

Figure 10:
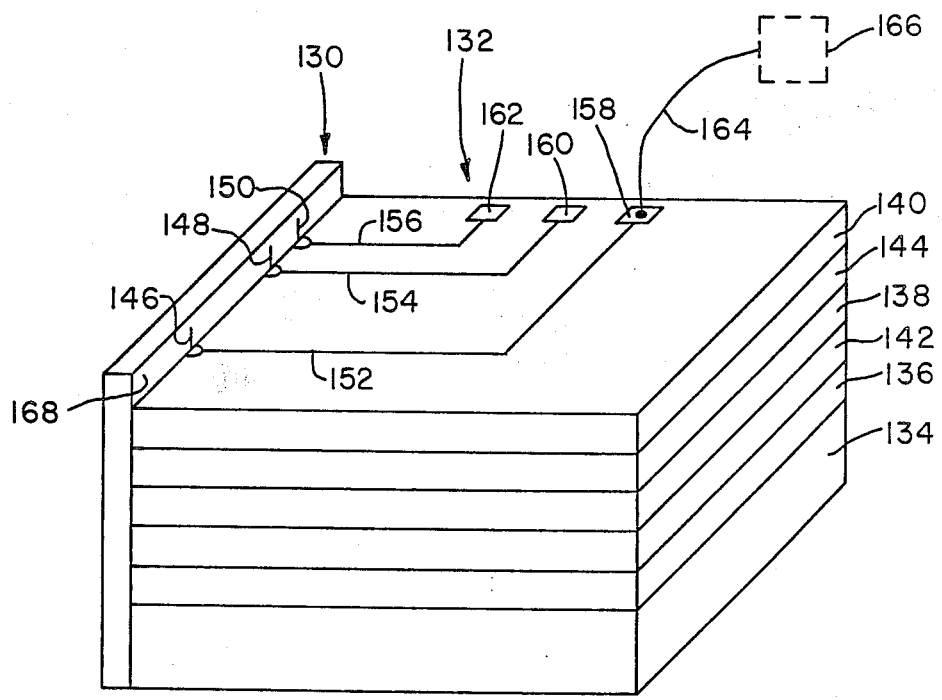
FIG. 10 is a perspective view of another modification of the embodiment in FIG. 1.

Referring now to FIG. 10, another modification of the present invention is stratoplexer 130 in conjunction with multilayer microelectronic structure 132 comprising substrate 134, integrated circuit layers 136, 138, 140, and spacer 142 between layers 136, 138 and spacer 144 between layers 138, 140. Spacers 142, 144 are made of a material such as silicon dioxide. Conductive paths 146, 148, 150 are disposed on stratoplexer 130, and conductive pathways 152, 154, 156 are disposed on layer 140. Paths 146, 148, 150 are electrically connected to pathways 152, 154, 156, respectively, and pathways 152, 154, 156 terminate at connector pads 158, 160, 162, respectively on layer 140. Also illustrated is a wire 164 electrically connected to connector pad 158 and extending to an external electrical device 166.

Stratoplexer 130 has a minimal overlap 168 and no connector pads, and in fact overlap 168 is exaggerated for clarity. When a layer of structure 132, such as layer 136 or 138, needs to be electrically interconnected with an external device 166, such connection can be accomplished by means of stratoplexer 130 and connector pad 158. Conductive paths 146, 148, 150 establish electrical connections between lower layers 136, 138 and conductive pathways 152, 154, 156. Here, as before, it must be stressed that additional conductive paths on stratoplexer 130 and additional conductive pathways on structure 132 are contemplated.

Figure 11:
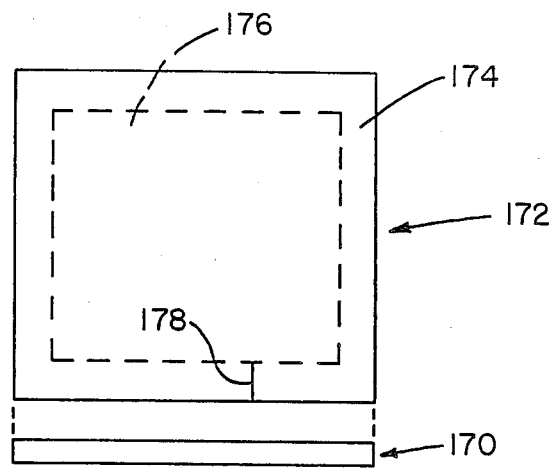
FIG. 11 is a top plan view of yet another modification of the present invention slightly spaced apart from a multilayer microelectronic structure.
Figure 12:
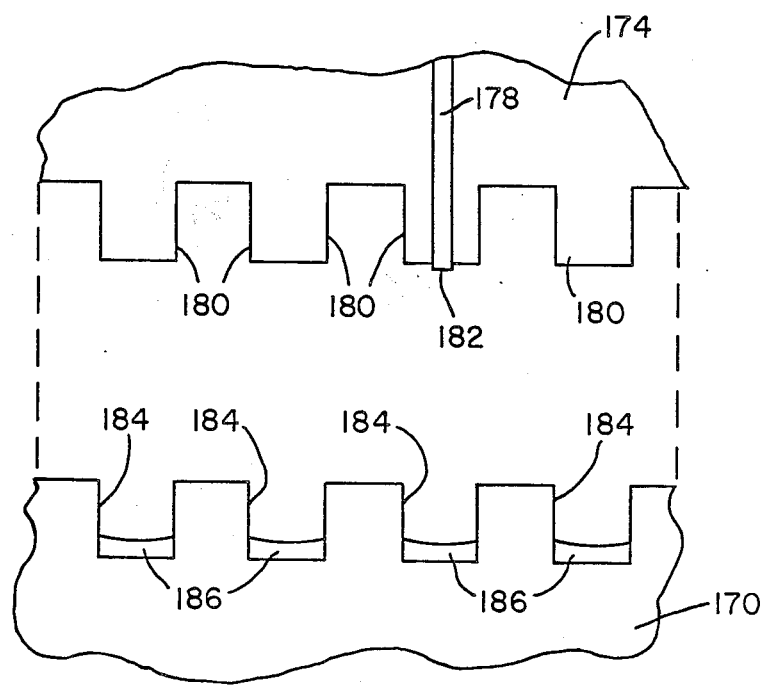
FIG. 12 is an enlarged fragmentary view of the modification in FIG. 11.

In the above embodiment and modifications of the present invention, the surface of the stratoplexers are typically planar, at least before a deposition of any patterns thereon. However, in a still further modification of the present invention the surface of the stratoplexer can be etched, using chemical or ion processes known in the art, to provide a regular series of parallel grooves, with the side edges of the stratolith etched with complementary projections so that the grooves and projections will mesh together properly. FIGS. 11 and 12 illustrate the above, wherein FIG. 11 depicts stratoplexer 170 slightly spaced apart from multilayer microelectronic structure 172. Structure 172 comprises top microelectronic layer 174 with inner circuitry 176 illustrated in dashed lines. Conductive pathway 178 proceeds from inner circuitry 176 to the edge of layer 174.

Referring to FIG. 12, conductive pathway 178 proceeds along one of the complementary projections 180 of layer 174 and extends a slight distance therebeyond as pad 182. Stratoplexer 170 is provided with a series of grooves 184 into which complementary projections 180 mesh when joined together. Conductive paths 186, which may be made of aluminum or similar material, are deposited in the bottom of grooves 184, and upon meshing structure 172 with stratoplexer 170, pad 182 electrically contacts one of the conductive paths 186, thereby providing a more secure connection therebetween.

While this invention has been described as having preferred embodiments, it will be understood that it is capable of further modifications. This application is therefore intended to cover any variations, uses, or adaptations of the invention following the general principles thereof, and including such departures from the present disclosure as come within known or customary practice in the art to which this invention pertains and fall within the limits of the appended claims.

What is claimed is:

1. A multilayer integrated circuit assembly comprising:
   a plurality of first integrated circuits, said circuits comprising generally planar interconnected arrays of active and passive barrier layer electrical circuit elements deposited on a single semiconductor substrate by a continuous series of compatible processes and capable of performing at least one complete electronic circuit function, said planar arrays arranged as layers in a layered stack, said layers each including at least one conductive path on a surface of each of said layers, said paths terminating in electrical contact points at side edges of said layers;
   a second substantially planar integrated circuit having opposed surfaces, a first of said opposed surfaces including a conductive path on a first portion thereof, said first surface portion disposed against said side edges of said layers, said conductive path on said first surface portion in electrical contact with at least one of said electrical contact points.

2. The device of claim 1 wherein one of said layers includes a plurality of conductive paths and corresponding contact points and said conductive path on said first surface portion contacts said plurality of electrical contact points located on said layer.

3. The device of claim 1 wherein said conductive path on said first surface portion contacts a plurality of electrical contact points located on a plurality of said layers.

4. The device of claim 1 wherein said first surface portion includes a predetermined pattern comprised of a plurality of conductive paths arranged for electrical contact with selected ones of a plurality of said electrical contact points of said layers.

5. The device of claim 4 wherein at least one of said conductive paths extends from said first surface portion to a second portion of said first surface, said at least one conductive path terminates in an electrical contact pad on said second surface portion.

6. The device of claim 4 wherein at least two of said plurality of conductive paths extend from said first surface portion to a second portion of said first surface and terminate in two electrical contact pads on said second surface portion, and wherein said plurality of electrical contact points are located on the same layer.

7. The device of claim 4 wherein said plurality of conductive paths extend from said first surface portion to a second portion of said first surface and terminate in a respective plurality of electrical contact pads on said second surface portion, and
   further comprising a microprocessor located on said second portion and electrically connected to selected ones of said plurality of conductive paths.

8. An electrical circuit assembly comprising:
   a stack of integrated circuits, said integrated circuits comprising generally planar interconnected arrays of active and passive barrier layer electrical circuit elements deposited in a single semi-conductor substrate by a continuous series of compatible processes including etching and photolithographic processes, said planar arrays including edge portions, said edge portions provided with electrical contact means, said contact means formed by means of said processes and connecting said integrated circuits into a circuit assembly;
   an electrical circuit interconnecting device comprising a generally planar surface having conductive paths thereon and disposed adjacent said edge portions for selective electrical contact of said conductive paths with said contact means;
   microprocessor means located on said surface and electrically connected in circuit with said conductive paths.

9. The device of claim 8 wherein said microprocessor multiplexes and demultiplexes electrical signals between selected ones of said plurality of conductive paths.

* * * * *